United States Patent [19]
Choo et al.

[11] Patent Number: 5,444,498
[45] Date of Patent: Aug. 22, 1995

[54] APPARATUS AND METHOD FOR EXTENDING PULLING RANGE OF AUTOMATIC FINE TUNING OF TELEVISION RECEIVER

[75] Inventors: Gyoung S. Choo; Deuk C. Kang, both of Kyungsangbook, Rep. of Korea

[73] Assignee: Goldstar Co., Ltd., Seoul, Rep. of Korea

[21] Appl. No.: 254,965

[22] Filed: Jun. 7, 1994

[30] Foreign Application Priority Data

Jun. 8, 1993 [KR] Rep. of Korea ............... 10353

[51] Int. Cl.⁶ ............................................. H04N 5/50
[52] U.S. Cl. .................................... 348/733; 348/735; 455/182.3; 455/192.3
[58] Field of Search ............... 348/731, 732, 733, 735; H04N 5/50; 455/182.3, 192.3

[56] References Cited

U.S. PATENT DOCUMENTS

| | | | |
|---|---|---|---|
| 3,944,725 | 3/1976 | Arumugham et al. | 178/5.8 A F |
| 4,263,675 | 4/1981 | Hongu et al. | 455/192 |
| 4,366,502 | 12/1982 | Shiu | 358/192.1 |
| 4,405,947 | 9/1983 | Tults et al. | 348/732 |
| 4,594,611 | 6/1986 | Sugibayashi et al. | 348/731 |
| 4,763,195 | 8/1988 | Tults et al. | 348/732 |
| 4,805,230 | 2/1989 | Tanaka | 348/731 |
| 4,819,069 | 4/1989 | Tanaka | 455/192.3 |
| 4,868,892 | 9/1989 | Telts et al. | 348/732 |
| 5,245,437 | 9/1993 | Na | 348/732 |
| 5,280,640 | 1/1994 | Bae | 348/732 |
| 5,299,011 | 3/1994 | Choi | 348/732 |
| 5,329,364 | 7/1994 | Lee | 455/182.3 |

FOREIGN PATENT DOCUMENTS

| | | |
|---|---|---|
| 2748997 | 5/1979 | Germany. |
| 5048983 | 2/1993 | Japan. |
| 2094080 | 9/1982 | United Kingdom. |
| 2142792 | 1/1985 | United Kingdom. |

Primary Examiner—James J. Groody
Assistant Examiner—Michael H. Lee
Attorney, Agent, or Firm—Ostrolenk, Faber, Gerb & Soffen

[57] ABSTRACT

An apparatus and a method for extending a pulling range of automatic fine tuning of a television receiver. An initial tuning voltage is applied to a tuner when a channel switching operation is performed or the television receiver is powered on. The tuning voltage to the tuner is controlled by bands as a result of comparison of an automatic fine tuning voltage of a specified channel with a first predetermined reference voltage. If the automatic fine tuning voltage is higher than the first predetermined reference voltage, it is checked whether the automatic fine tuning voltage is within a desired range. The tuning voltage to the tuner is controlled by the bands if the automatic fine tuning voltage is not within the desired range, to maintain the automatic fine tuning voltage within the desired range. Presence of a synchronous signal of the specified channel is checked if the automatic fine tuning voltage is within the desired range. If the synchronous signal of the specified channel is present, the tuning voltage to the tuner is controlled by the bands to maintain the automatic fine tuning voltage within the desired range. If the synchronous signal of the specified channel is not present, the initial tuning voltage is applied to the tuner to continue to check the presence of the synchronous signal.

18 Claims, 8 Drawing Sheets

FIG. 5A

| DIGITAL DATA | VAFT | DIGITAL DATA | VAFT |
|---|---|---|---|
| 0 | 0 — 0.15[V] | 8 | 2.34 — 2.65[V] |
| 1 | 0.15 — 0.46[V] | 9 | 2.65 — 2.96[V] |
| 2 | 0.46 — 0.78[V] | A | 2.96 — 3.28[V] |
| 3 | 0.78 — 1.09[V] | B | 3.28 — 3.59[V] |
| 4 | 1.09 — 1.40[V] | C | 3.59 — 3.90[V] |
| 5 | 1.40 — 1.71[V] | D | 3.90 — 4.21[V] |
| 6 | 1.71 — 2.03[V] | E | 4.21 — 4.53[V] |
| 7 | 2.04 — 2.34[V] | F | 4.53 — 5.00[V] |

FIG. 5B

| DIGITAL DATA | SYNCHRONOUS VOLTAGE |
|---|---|
| 0 | 0.0 — 3.0[V] |
| 1 | 3.5 — 5.0[V] |

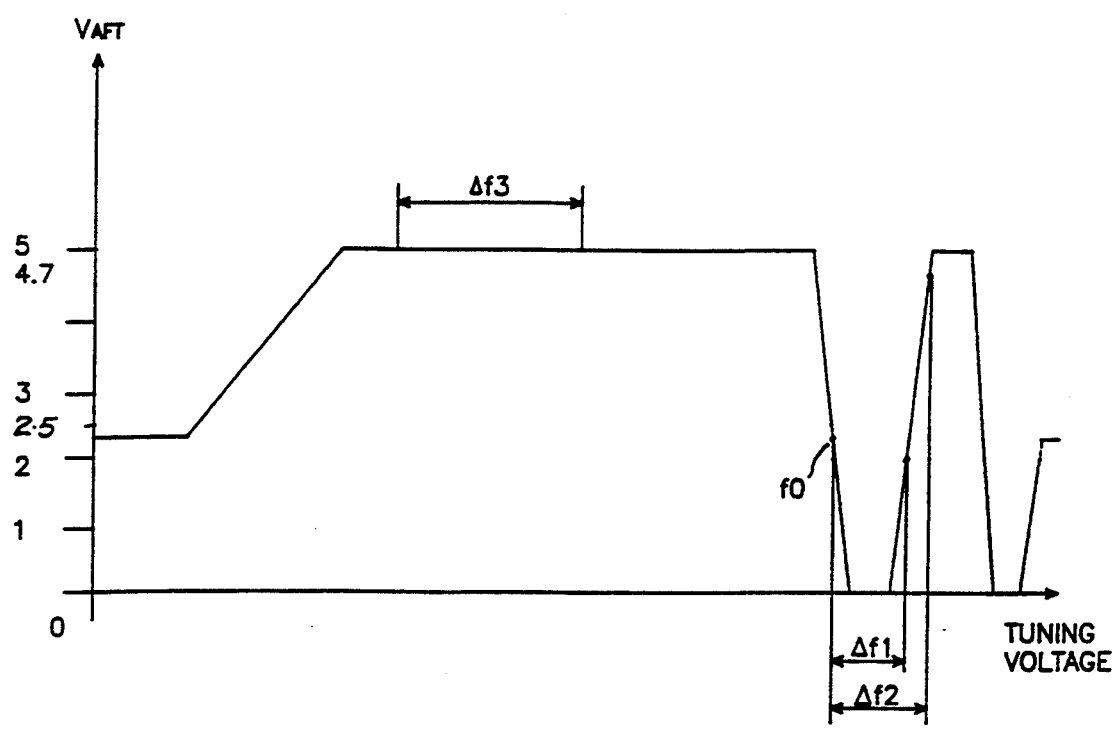

APPARATUS AND METHOD FOR EXTENDING PULLING RANGE OF AUTOMATIC FINE TUNING OF TELEVISION RECEIVER

BACKGROUND OF THE INVENTION

1. Field of the Invention

The present invention relates in general to automatic fine tuning (AFT) of a television (TV) receiver employing a voltage synthesizer (VS), and more particularly to an apparatus and a method for extending a pulling range of the automatic fine tuning of the TV receiver, thereby to prevent a shortage in the pulling range of the automatic fine tuning when a TV channel is switched or the TV receiver is powered on and a detuning due to a variation in characteristics of components at a high or low temperature.

2. Description of the Prior Art

Referring to FIG. 1, there is shown a block diagram of a conventional automatic fine tuning system for a TV receiver employing a video synthesizer. As shown in this drawing, the conventional automatic fine tuning system comprises a tuner 24 for tuning a TV broadcasting signal received through an antenna ANT to a specified channel corresponding to a tuning voltage from a microcomputer 23 and outputting an intermediate frequency (IF) signal of the tuned TV broadcasting signal, and an IF processor 25 for processing the IF signal of the tuned TV broadcasting signal from the tuner 24 to output an automatic fine tuning voltage $V_{AFT}$ and a synchronous signal to the microcomputer 23 and a video signal of the tuned TV broadcasting signal to a video processor 26.

The video processor 26 is adapted to process the video signal from the IF processor 25 to output red (R), green (G) and blue (B) color signals.

The conventional automatic fine tuning system also comprises a key matrix unit 21 for outputting an electrical signal corresponding to a pushed key thereon to the microcomputer 23, and a remote receiver 22 for receiving a remote signal from a remote controller (not shown), converting the received remote signal into an electrical signal and outputting the converted electrical signal to the microcomputer 23.

The microcomputer 23 is adapted to check input of the automatic fine tuning voltage $V_{AFT}$ and the synchronous signal from the IF processor 25. Also, the microcomputer 23 generates the tuning voltage in response to tuning data from the remote receiver 22 or the key matrix unit 21 and outputs the generated tuning voltage to the tuner 24, thereby allowing the tuner 24 to tune the channel finely.

Also, the conventional automatic fine tuning system comprises an on-screen display (OSD) character generator 27 for generating a caption character signal addressed by the microcomputer 23 when the corresponding channel is tuned by the tuner 24, and a video synthesizer 28 for synthesizing the caption character signal from the OSD character generator 27 and the R, G and B color signals from the video processor 26 and outputting the resultant signal to a color picture tube (CPT) 29.

The operation of the conventional automatic fine tuning system with the abovementioned construction will hereinafter be described with reference to FIGS. 2A to 3. FIGS. 2A and 2B are waveform diagrams of the automatic fine tuning voltage $V_{AFT}$ and the synchronous signal from the IF processor 25 in FIG. 1, respectively, and FIG. 3 is a flowchart illustrating a conventional method of controlling the automatic fine tuning voltage $V_{AFT}$ from the IF processor 25 in FIG. 1.

At the first step S31 of FIG. 3, in the case where a desired key on the remote controller, not shown, is pushed by the user to power on the TV receiver or switch the TV channel, the corresponding remote signal, perhaps an infrared-ray signal, is generated from the remote controller and then received by the remote receiver 22. The remote receiver 22 converts the received remote signal into the electrical signal and outputs the converted electrical signal as the tuning data to the microcomputer 23. Alternatively, at the first step S31, when a desired key on the key matrix unit 21 is pushed by the user to power on the TV receiver or switch the TV channel, the corresponding electrical signal from the key matrix unit 21 is applied as the tuning data to the microcomputer 23.

Upon receiving the tuning data from the remote receiver 22 or the key matrix unit 21, the microcomputer 23 outputs an initial tuning voltage as shown in FIG. 2A to the tuner 24 to select an initial channel band, at the second step S32. As shown in FIG. 2A, the initial tuning voltage from the microcomputer 23 corresponds to a center frequency fo.

Then, the tuner 24 tunes the TV broadcasting signal received through the antenna ANT to the specified channel corresponding to the initial tuning voltage from the microcomputer 23 and outputs the IF signal of the tuned TV broadcasting signal to the IF processor 25. The IF processor 25 processes the IF signal of the tuned TV broadcasting signal from the tuner 24, so as to output the video signal of the tuned TV broadcasting signal to the video processor 26. Also, the IF processor 25 outputs the automatic fine tuning voltage $V_{AFT}$ and the synchronous signal to automatic fine tuning and identification terminals AFT and ID of the microcomputer 23, respectively.

At the third step S33, the operation of the microcomputer 23 is delayed for a predetermined time period (for example, 300 ms) as shown in FIG. 2B from the power-on till a normal state of the TV receiver. After the lapse of the predetermined time period, the microcomputer 23 checks the input of the synchronous signal from the IF processor 25 to its identification terminal ID at the fourth step S34.

If it is checked at the fourth step S34 that the synchronous signal from the IF processor 25 is not inputted by the identification terminal ID, the microcomputer 23 returns to the second step S32 to continue to output the initial tuning voltage corresponding to the initial center frequency fo to the tuner 24. On the contrary, if it is checked at the fourth step S34 that the synchronous signal from the IF processor 25 is inputted by the identification terminal ID, the microcomputer 23 proceeds to the fifth step S35.

At the fifth step S35, the microcomputer 23 compares the automatic fine tuning voltage $V_{AFT}$ which is fed back from the IF processor 25 to its automatic fine tuning terminal AFT with first and second predetermined reference voltages having a desired range of 2.0–3.0 V. If the automatic fine tuning voltage $V_{AFT}$, initially stored, corresponding to the initial center frequency fo is within the desired range of 2.0–3.0 V as shown in FIG. 2A in accordance with the compared result, namely, the normal state, the microcomputer 23 returns to the third step S33 to perform it again for the predetermined time period.

On the contrary, if the automatic fine tuning voltage $V_{AFT}$ corresponding to the initial center frequency fo is not within the desired range of 2.0–3.0 V as a result of the comparison, the microcomputer 23 performs the sixth step S36 and then returns to the third step S33.

At the sixth step S36, if the automatic fine tuning voltage $V_{AFT}$ is lower than the first predetermined reference voltage of 2.0 V, the microcomputer 23 decreases the tuning voltage to the tuner 24. If the automatic fine tuning voltage $V_{AFT}$ is higher than the second predetermined reference voltage of 3.0 V, the microcomputer 23 increases the tuning voltage to the tuner 24.

Therefore, the automatic fine tuning voltage $V_{AFT}$ red back from the IF processor 25 is connected to always have the desired range of 2.0–3.0 V, thereby allowing the tuner 24 to tune the channel finely.

In detail, if the automatic fine tuning voltage $V_{AFT}$ is lower, at a point b in FIG. 2A, than the first predetermined reference voltage of 2.0 V, the microcomputer 23 outputs a new tuning voltage lower than the previous one to the tuner 24. If the automatic fine tuning voltage $V_{AFT}$ is higher, at a point a in FIG. 2A, than the second predetermined reference voltage of 3.0 V, the microcomputer 23 outputs a new tuning voltage higher than the previous one to the tuner 24. In this manner, the automatic fine tuning voltage is corrected.

By the way, when the synchronous signal is not detected or the automatic fine tuning voltage $V_{AFT}$ is not within the desired range of 2.0–3.0 V although the above operation is repeatedly performed at least once, the microcomputer 23 considers the corresponding channel to have no broadcasting signal. Hence, the microcomputer 23 outputs the tuning voltage corresponding to the center frequency to the tuner 24 and then stops the automatic fine tuning operation.

On the other hand, the OSD character generator 27 generates the caption character signal addressed by the microcomputer 23 when the corresponding channel is tuned by the tuner 24. The caption character signal from the OSD character generator 27 is applied to the video synthesizer 28, which also receives the R, G and B color signals from the video processor 26. Then, the video synthesizer 28 synthesizes the received caption character signal and R, G and B color signals and outputs the resultant signal to the CPT 29.

Noticeably, in the above-mentioned conventional automatic fine tuning system for the TV receiver employing the video synthesizer, if the automatic fine tuning voltage is detected in an audio band to be lower than 2.0 V as shown by a point d in FIG. 2A because of temperature characteristics of the tuner 24 and the IF processor 25, file microcomputer 23 outputs a new tuning voltage lower than the previous one to the tuner 24, thereby to correct the automatic fine tuning voltage to have the desired range of 2.0–3.0 V. Also, if the automatic fine tuning voltage is detected in the audio band to be higher than 3.0 V as shown by a point c in FIG. 2A, the microcomputer 23 outputs a new tuning voltage higher than the previous one to the tuner 24. As a result, the automatic fine tuning voltage is corrected to have the desired range of 2.0–3.0 V. In this connection, the above-mentioned conventional automatic fine tuning system has a disadvantage in that an asynchronous picture is displayed on the CPT 29 because the channel is tuned under the condition that the center frequency fo is detuned upwardly by Δf (2 MHz). Also, the display picture is flickered on the CPT 29 for the time required in automatically tuning the channel finely.

SUMMARY OF THE INVENTION

Therefore, the present invention has been made in view of the above problems, and it is an object of the present invention to provide an apparatus and a method for extending a pulling range of automatic fine tuning of a TV receiver in which a tuning voltage to a tuner is decreased until an automatic fine tuning voltage becomes higher than a predetermined level and a center frequency is then tuned finely within a desired voltage range, so that the pulling range of the automatic fine tuning can be extended to an audio band and a detuning due to a variation in characteristics of components can be prevented at a high or low temperature.

In accordance with one aspect of the present invention, there is provided an apparatus for extending a pulling range of automatic fine tuning of a television receiver, comprising tuning means for tuning a television broadcasting signal received through an antenna to a specified channel corresponding to an external tuning voltage when a channel switching operation is performed or the television receiver is powered on and outputting an intermediate frequency signal of the tuned television broadcasting signal; intermediate frequency processing means for processing the intermediate frequency signal of the tuned television broadcasting signal from said tuning means to output an automatic fine tuning voltage and a synchronous signal: buffering means for buffering the automatic fine tuning voltage and the synchronous signal from said intermediate frequency processing means; and control means for decreasing the tuning voltage to said tuning means until the automatic fine tuning voltage buffered by said buffering means becomes higher than a first predetermined reference voltage and controlling the tuning voltage to said tuning means if the automatic fine tuning voltage buffered by said buffering means becomes higher than the first predetermined reference voltage, to maintain the automatic fine tuning voltage buffered by said buffering means within a desired range between second and third predetermined reference voltages.

In accordance with another aspect of the present invention, there is provided a method of extending a pulling range of automatic fine tuning of a television receiver, comprising the steps of (a) outputting an initial tuning voltage to a tuner when a channel switching operation is performed or the television receiver is powered on and receiving an automatic fine tuning voltage of a specified channel which is tuned by said tuner according to the outputted initial tuning voltage; (b) comparing the received automatic fine tuning voltage with a first predetermined reference voltage and controlling the tuning voltage to said tuner by bands in accordance with the compared result; (e) checking whether the received automatic fine tuning voltage is within a desired range between second and third predetermined reference voltages, if the received automatic fine tuning voltage is higher than the first predetermined reference voltage, and controlling the tuning voltage to said tuner by the bands if it is checked that the received automatic fine tuning voltage is not within the desired range, to maintain the received automatic fine tuning voltage within the desired range; and (d) checking presence of a synchronous signal of the specified channel if the received automatic fine tuning voltage is within the desired range, controlling the tuning voltage to said tuner by the bands if it is checked that the synchronous signal of the specified channel is present, to maintain the received automatic fine tuning voltage within the desired range, and outputting the initial tuning voltage to said tuner if it is checked that the synchronous signal of the specified channel is not present, to continue to check the presence of the synchronous signal of the specified channel.

BRIEF DESCRIPTION OF THE DRAWINGS

The above and other objects, features and advantages of the present invention will be more clearly understood from the following detailed description taken in conjunction with the accompanying drawings, in which:

FIGS. 5A and 5B are tables illustrating digital values of an automatic fine tuning voltage and a synchronous signal from an IF processor in FIG. 4, respectively;

FIG. 6 is a waveform diagram of the automatic fine tuning voltage from the IF processor in FIG. 4, which illustrates the extended pulling range of the automatic fine tuning in accordance with the present invention;

FIG. 7 is a table illustrating tuning voltage speeds by bands in accordance with the present invention.

DETAILED DESCRIPTION OF THE PREFERRED EMBODIMENTS

Figure 1:
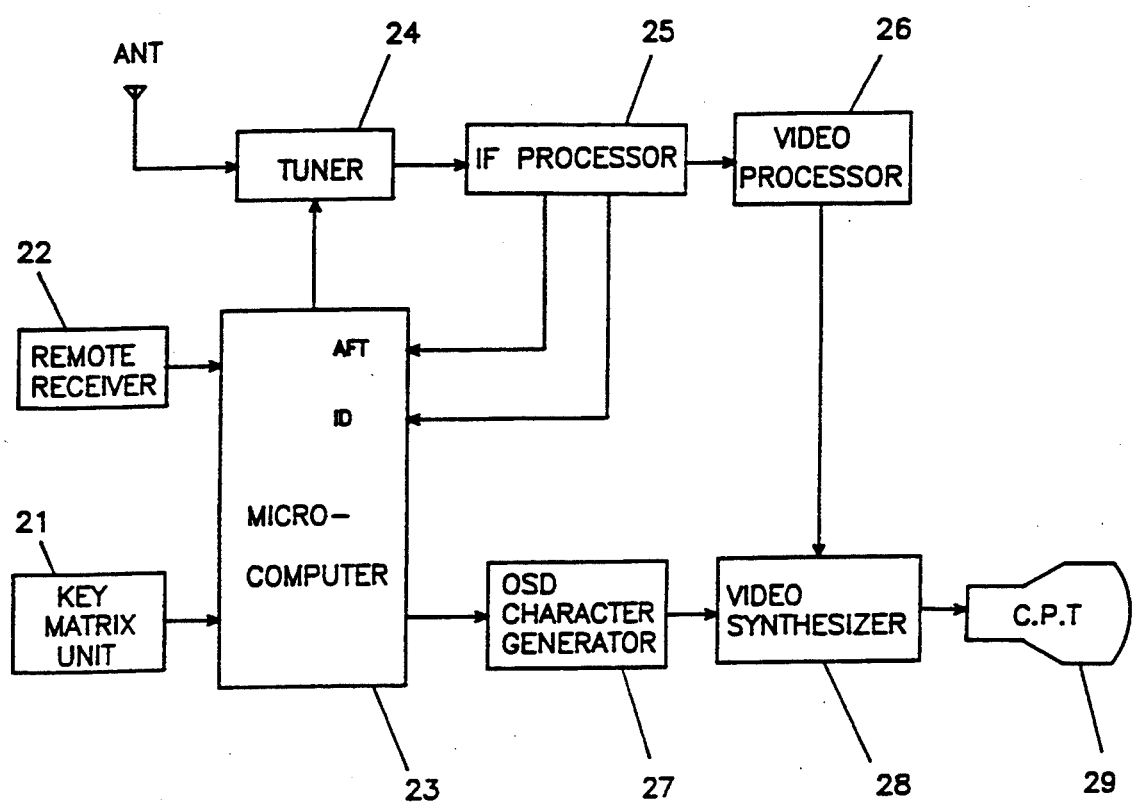
FIG. 1 is a block diagram of a conventional automatic fine tuning system for a TV receiver employing a voltage synthesizer.
Figure 2A:
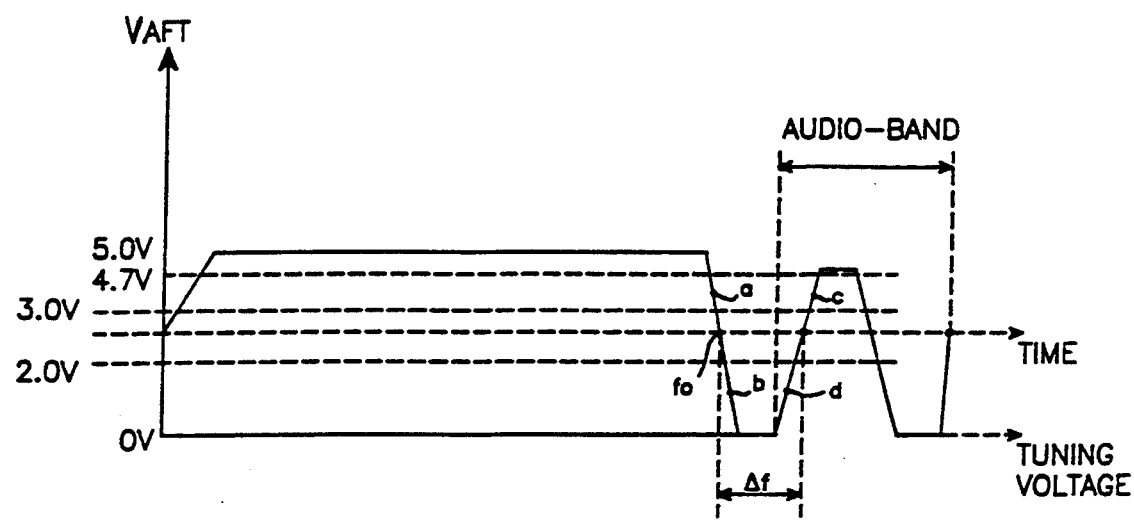
FIGS. 2A and 2B are waveform diagrams of an automatic fine tuning voltage and a synchronous signal from an IF processor in FIG. 1, respectively.
Figure 2B:
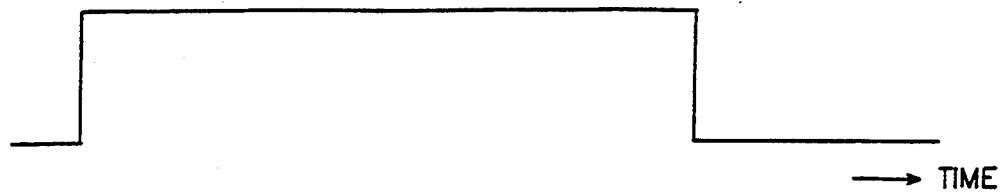
Figure 3:
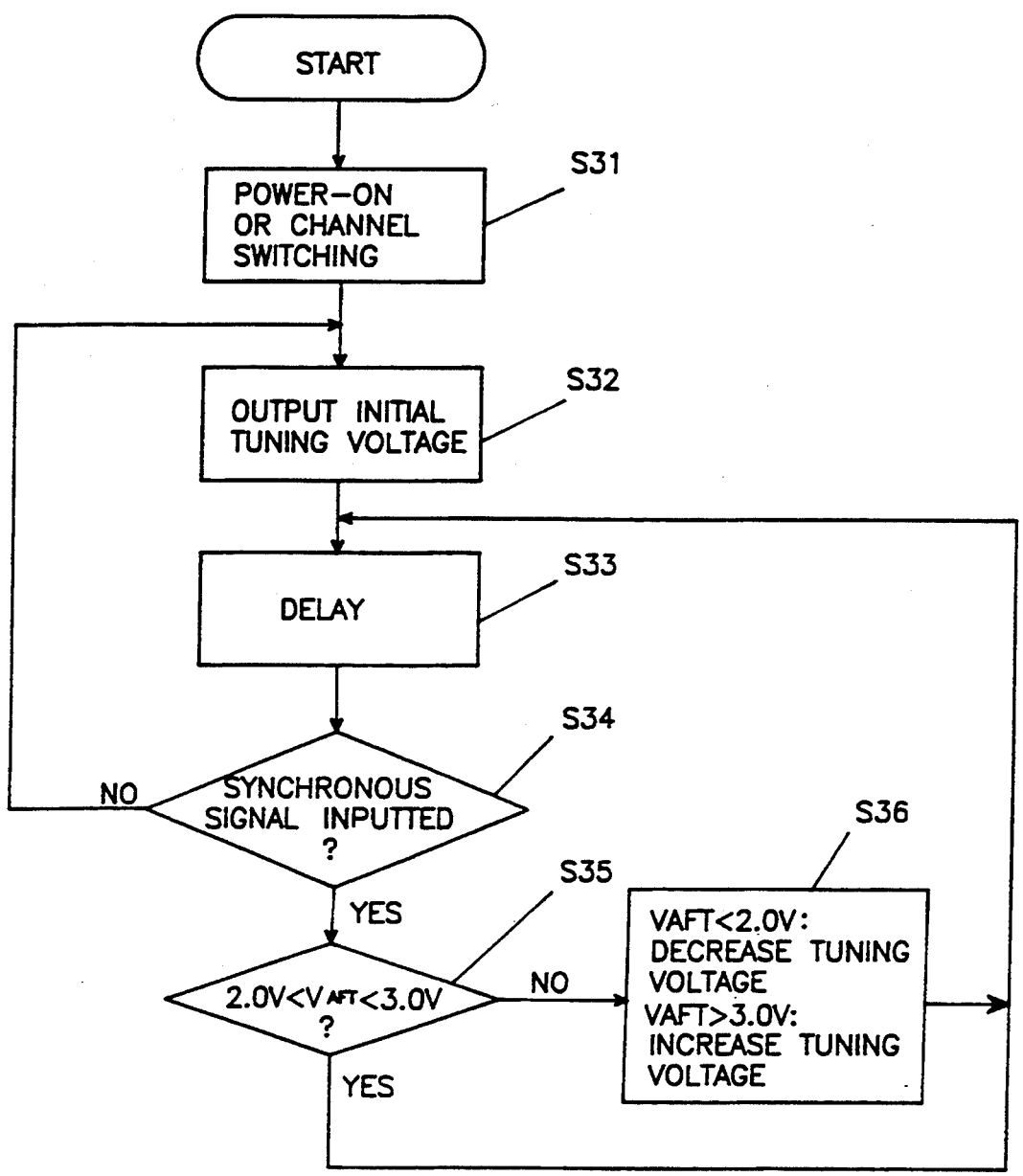
FIG. 3 is a flowchart illustrating a conventional method of controlling the automatic fine tuning voltage from the IF processor in FIG. 1.
Figure 4:
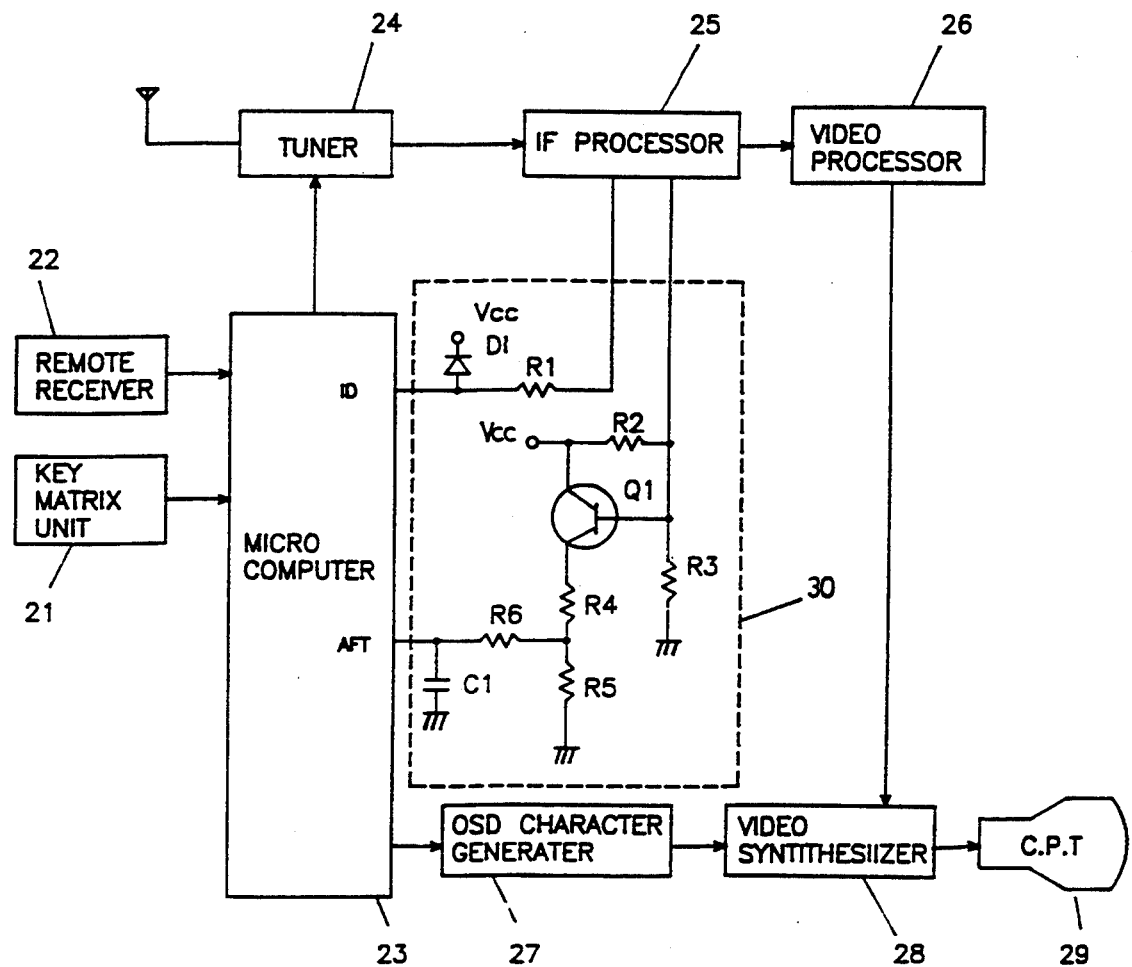
FIG. 4 is a block diagram of an apparatus for extending a pulling range of automatic fine tuning of a TV receiver in accordance with the present invention.

Referring to FIG. 4, there is shown a block diagram of an apparatus for extending a pulling range of automatic fine tuning of a TV receiver in accordance with the present invention. The construction of this figure is substantially the same as that of FIG. 1, with the exception that a buffering circuit 30 is connected between the IF processor 25 and the microcomputer 23 to buffer the automatic fine tuning voltage and the synchronous signal from the IF processor 25.

The buffering circuit 30 includes a resistor R1 connected between an synchronous signal output terminal of the IF processor 25 and the identification terminal ID of the microcomputer 23, a diode D1 having an anode connected between the identification terminal ID of the microcomputer 23 and the resistor R1 and a cathode connected to a power source terminal Vcc, a resistor R2 having one side connected to the power source terminal Vcc and the other side connected to an automatic fine tuning voltage output terminal of the IF processor 25, a resistor R3 having one side connected to a ground and the other side connected to the other side of the resistor R2, a transistor Q1 having a base connected between the resistors R2 and R3, a collector connected to the power source terminal Vcc and an emitter connected to the ground through resistors R4 and R5 connected in series, and a resistor R6 having one side connected between the resistors R4 and R5 and the other side connected to the ground through a capacitor C1 and to the automatic fine tuning terminal AFT of the microcomputer 23.

The operation of the buffering circuit 30 with the above-mentioned construction in accordance with the present invention will hereinafter be described in detail.

The synchronous signal from the IF processor 25 is transferred to the identification terminal ID of the microcomputer 23 through the resistor R1. At this time, the diode D1 functions to protect the microcomputer 23 against the synchronous signal from the IF processor 25. The automatic fine tuning voltage from the IF processor 25 is divided by the resistors R2 and R3 and then applied to the base of the transistor Q1, thereby causing the transistor Q1 to be turned on. In this case, the automatic fine tuning voltage divided by the resistors R2 and R3 is passed through the resistor R2 and the turned-on transistor Q1, divided by the resistors R4 and R5 and then applied through the resistor R6 to the automatic fine tuning terminal AFT of the microcomputer 23. Here, the capacitor C1 acts to remove a high frequency component of the automatic fine tuning voltage which is applied to the automatic fine tuning terminal AFT of the microcomputer 23 through the resistor R6.

Noticeably, the transistor Q1 is a buffering transistor which is interfaced between the automatic fine tuning terminal AFT of the microcomputer 23 and the automatic fine tuning voltage output terminal of the IF processor 25 to reduce an effect of an external impedance on an automatic fine tuning voltage output circuit of the IF processor 25 processing the high frequency component and to facilitate the division of the automatic fine tuning voltage from the IF processor 25 in the buffering circuit 30.

Now, a method of extending the pulling range of the automatic fine tuning of the TV receiver in accordance with the present invention will be described in detail with reference to FIGS. 4 to 8B. FIGS. 5A and 5B are tables illustrating digital values of the automatic fine tuning voltage and the synchronous signal from the IF processor 25 in FIG. 4, respectively, FIG. 6 is a waveform diagram of the automatic fine tuning voltage from the IF processor 25 in FIG. 4, which illustrates the extended pulling range of the automatic fine tuning in accordance with the present invention. FIG. 7 is a table illustrating tuning voltage speeds by bands in accordance with the present invention, and FIGS. 8A and 8B are flowcharts illustrating the method of extending the pulling range of the automatic fine tuning of the TV receiver in accordance with the present invention.

Figure 8A:
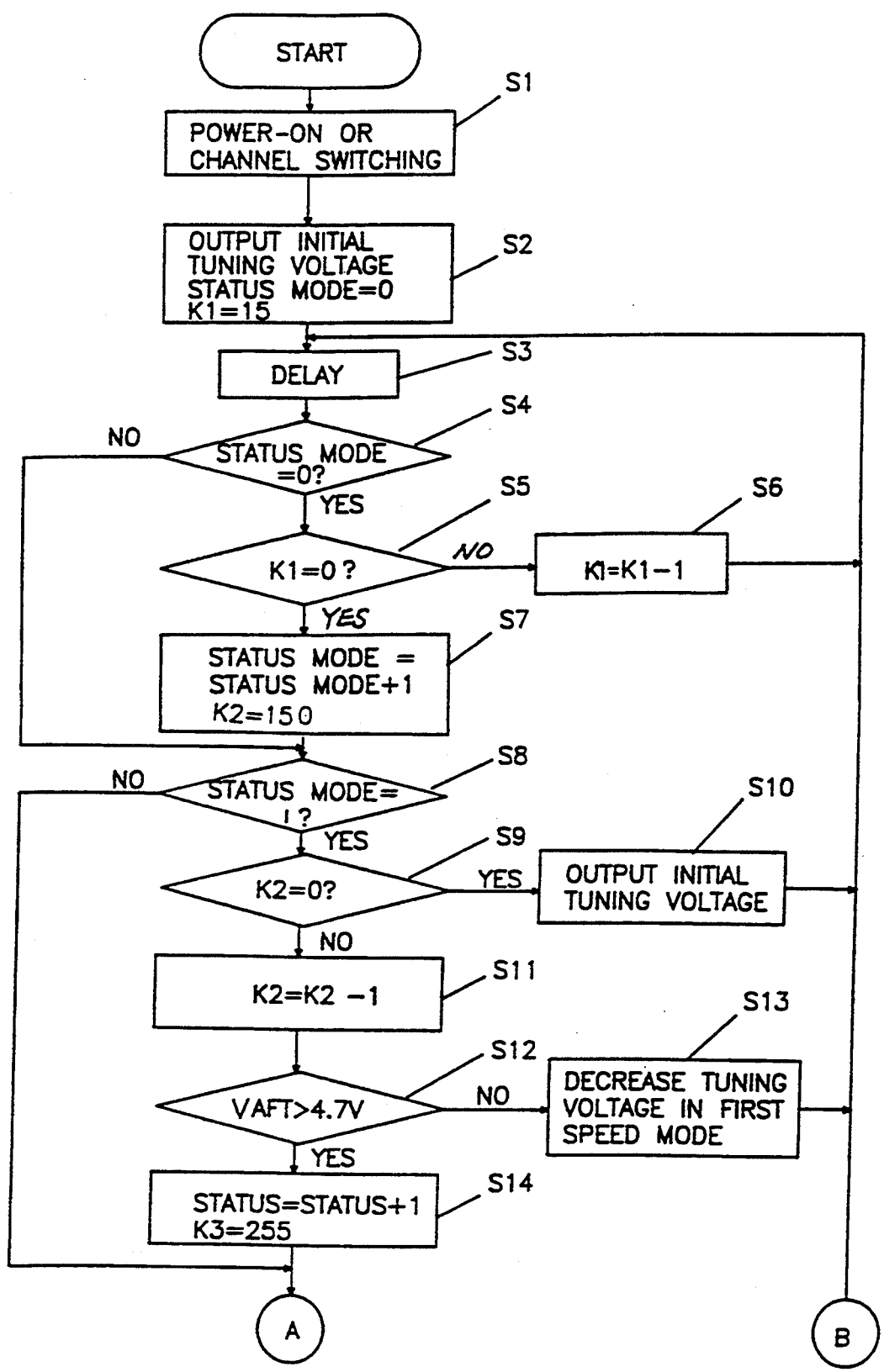
FIGS. 8A and 8B are flowcharts illustrating a method of extending the pulling range of the automatic fine tuning of the TV receiver in accordance with the present invention.
Figure 8B:
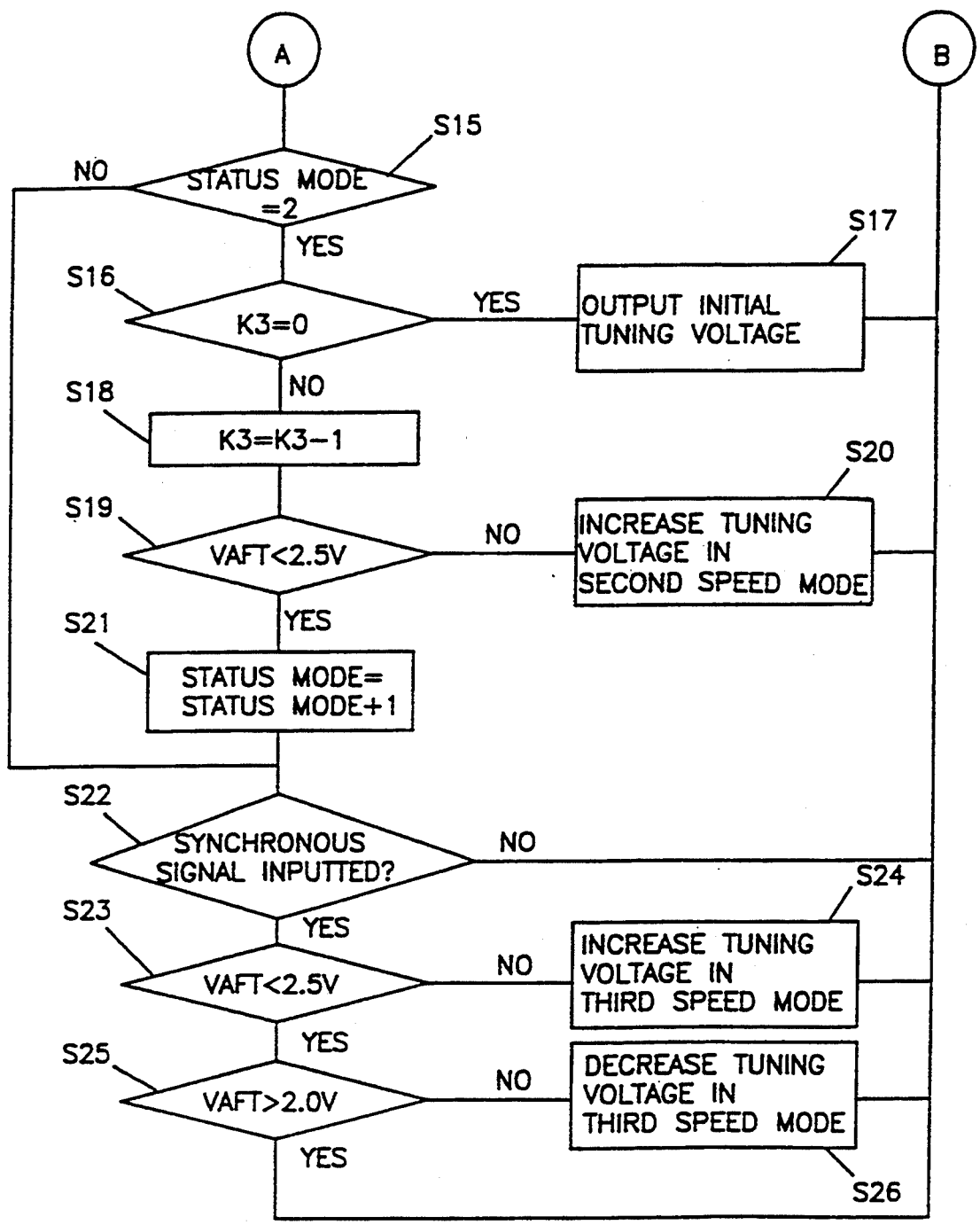

At the first step S1 of FIG. 8A, in the case where a desired key on the remote controller (not shown) is pushed by the user to power on the TV receiver or switch the TV channel, the corresponding remote signal such as, for example, the infrared-ray signal, is generated from the remote controller and then received by the remote receiver 22. The remote receiver 22 converts the received remote signal into the electrical signal and outputs the converted electrical signal as the tuning data to the microcomputer 23. Also, at the first step S1, when a desired key on the key matrix unit 21 is pushed by the user to power on the TV receiver or switch the TV channel, the corresponding electrical signal from the key matrix unit 21 is applied as the tuning data to the microcomputer 23.

Upon receiving the tuning data from the remote receiver 22 or the key matrix unit 21, the microcomputer 23 outputs a previously stored initial tuning voltage as shown in FIG. 6 to the tuner 24 at the second step S2. As shown in FIG. 6, the initial tuning voltage from the microcomputer 23 corresponds to an initial center frequency fo. Also, file microcomputer 23 sets a status mode to "0" and a count K1 to "15", respectively.

Then, the operation of the microcomputer 23 is delayed for a predetermined time period (for example, 20 ms) at the third step S3. After the lapse of the predetermined time period, the microcomputer 23 checks at the fourth step S4 whether the initially set status mode is "0". If it is checked at the fourth step S4 that the status mode is not "0", the microcomputer 23 proceeds to the eighth step S8. On the contrary, if it is checked at the fourth step S4 that the status mode is "0", the microcomputer 23 proceeds to the fifth step S5.

At the fifth step S5, the microcomputer 23 checks whether the count K1 is "0". If it is checked at the fifth step S5 that the count K1 is not "0", namely, the time of 300 ms (20 ms × 15) has not elapsed, the microcomputer 23 performs the sixth step S6 and then returns to the third step S3.

At the sixth step S6, the microcomputer 23 decrements the count K1 by "1". At that time the count K1 reaches "0" with the above steps repeatedly performed, namely, the set is stabilized with the lapse of the time of 300 ms (20 ms × 15), the microcomputer 23 performs the seventh step S7 of incrementing the status mode by "1" and setting a count K2 again to "150" to check the automatic fine tuning voltage $V_{AFT}$ from the IF processor 25.

At the eighth step S8, the microcomputer 23 checks whether the status mode is "1". If it is checked at the eighth step S8 that the status mode is not "1", the microcomputer 23 proceeds to the fifteenth step S15. On the contrary, if it is checked at the eighth step S8 that the status mode is "1", the microcomputer 23 proceeds to the ninth step S9 to check whether the count K2 is "0".

If it is checked at the ninth step S9 that the count K2 is "0", the microcomputer 23 performs the tenth step S10 and then returns to the third step S3. At the tenth step S10, the microcomputer 23 outputs the initial tuning voltage to the tuner 24. On the contrary, if it is checked at the ninth step S9 that the count K2 is not "0", the microcomputer 23 proceeds to the eleventh step S11 of decrementing the count K2 by "1".

Then, at the twelfth step S12, the microcomputer 23 compares the automatic fine tuning voltage $V_{AFT}$ as shown in FIG. 6 with a reference voltage of 4.7 V. The automatic fine tuning voltage $V_{AFT}$ to be compared is detected by the IF processor 25, buffered by the buffering circuit 30 and then applied to the microcomputer 23. Namely, the tuner 24 tunes the TV broadcasting signal received through the antenna ANT to the specified channel corresponding to the tuning voltage from the microcomputer 23 and outputs the IF signal of the tuned TV broadcasting signal to the IF processor 25. The IF processor 25 processes the IF signal of the tuned TV broadcasting signal from the tuner 24, so as to output the video signal of the tuned TV broadcasting signal to the video processor 26. Also, the IF processor 25 outputs the automatic fine tuning voltage $V_{AFT}$ and the synchronous signal to the microcomputer 23.

The synchronous signal from the IF processor 25 is applied to the identification terminal ID of the microcomputer 23 through the resistor R1 of the buffering circuit 30. Also, in the buffering circuit 30, the automatic fine tuning voltage $V_{AFT}$ from the IF processor 25 is dropped by the resistors R2 and R3, buffered by the transistor Q1 and then applied to the automatic fine tuning terminal AFT of the microcomputer 23 through the resistors R4, R5 and R6 and the capacitor C1.

While decrementing the count K2 gradually as stated previously, the microcomputer 23 converts the analog automatic fine tuning voltage $V_{AFT}$ buffered by the buffering circuit 30 into digital data as shown in FIG. 5A and compares the converted digital data with the reference voltage of 4.7 V as shown in FIG. 6. If the automatic fine tuning voltage $V_{AFT}$ is lower than the reference voltage of 4.7 V as a result of the comparison, the microcomputer 23 performs the thirteenth step S13 and then returns to the third step S3.

At the thirteenth step S13, the microcomputer 23 decreases the tuning voltage to the tuner 24 at tuning speeds by bands in a first speed mode A as shown in FIG. 7. With the above steps repeatedly performed, the automatic fine tuning voltage $V_{AFT}$ is maintained higher than the reference voltage of 4.7 V.

In the first speed mode A, a unit speed of the tuning voltage to the tuner 24 is 33/16384 V. In the case where the tuning voltage to the tuner 24 is decreased in the first speed mode A, the speeds of the tuning voltage to the tuner 24 by the bands are 8×33/16384 V in a VHF-L system, 4×33/16384 V in a VHF-H system and 2×33/16384 V in a UHF system.

On the other hand, in the case where the automatic fine tuning voltage $V_{AFT}$ does not become higher than the reference voltage of 4.7 V while the count K2 is decremented by "1" by up to "0", the microcomputer 23 regards the TV broadcasting signal tuned by the tuner 24 as an abnormal one and thus outputs the initial tuning voltage to the tuner 24. On the contrary, if the automatic fine tuning voltage $V_{AFT}$ becomes higher than the reference voltage of 4.7 V at the twelfth step S12, the microcomputer proceeds to the fourteenth step S14.

At the fourteenth step S14, the microcomputer 23 increments the status mode by "1" and sets a count K3 again to "255". It is checked at the fifteenth step S15 whether the status mode is 2. If it is checked at the fifteenth step S15 that the status mode is not 2, the microcomputer 23 proceeds to the twenty-second step S22. On the contrary, if it is checked at the fifteenth step S15 that the status mode is 2, the microcomputer 23 proceeds to the sixteenth step S16.

The microcomputer 23 checks at file sixteenth step S16 whether the count K3 is "0". If it is checked at the sixteenth step S16 that the count K3 is "0", the microcomputer 3 performs the seventeenth step S17 and then returns to the third step S3. On the contrary, if it is checked at the sixteenth step S16 that the count K3 is not "0", the microcomputer 23 proceeds to the eighteenth step S18.

At the seventeenth step S17, the microcomputer 23 outputs the initial tuning voltage to the tuner 24. Then, the microcomputer 23 decrements the count K3 by "1" at the eighteenth step S18 and compares the automatic fine tuning voltage $V_{AFT}$ with a reference voltage of 2.5 V at the nineteenth step S19. If the automatic fine tuning voltage $V_{AFT}$ is higher than the reference voltage of 2.5 V at the nineteenth step S19, the microcomputer 23 proceeds to the twentieth step S20 of increasing the tuning voltage to the tuner 24 in a second speed mode B as shown in FIG. 7 and then returns to the third step S3. With the above steps repeatedly perforated, the automatic fine tuning voltage $V_{AFT}$ is maintained lower than the reference voltage of 2.5 V.

On the other hand, if the automatic fine tuning voltage $V_{AFT}$ is lower than the reference voltage of 2.5 V at the nineteenth step S19, the microcomputer 23 proceeds to the twenty-first step S21 of incrementing the status mode by "1".

In other words, while decrementing the count K3 gradually, the microcomputer 23 converts the analog automatic fine tuning voltage $V_{AFT}$ buffered by the buffering circuit 30 into the digital data as shown in FIG. 5A and compares the converted digital data with the reference voltage of 2.5 V as shown in FIG. 6. In this case, because the automatic fine tuning voltage $V_{AFT}$ is higher than the reference voltage of 4.7 V, the microcomputer 23 increases the tuning voltage to the tuner 24 at tuning speeds by bands in the second speed mode B as shown in FIG. 7. As a result, the automatic fine tuning voltage $V_{AFT}$ is maintained lower than the reference voltage of 2.5 V.

In the case where the automatic fine tuning voltage $V_{AFT}$ does not become lower than the reference voltage of 2.5 V while the count K3 is decremented by "1" by up to "0", the microcomputer 23 regards the TV broadcasting signal tuned by the tuner 24 as an abnormal one and thus outputs the initial tuning voltage to the tuner 24.

When the automatic fine tuning voltage $V_{AFT}$ is decreased to become lower than the reference voltage of 2.5 V as the tuning voltage to the tuner 24 is increased in the second speed mode B, the microcomputer 23 increments the status mode by "1".

At the twenty-second step S22, the microcomputer 23 inputs the analog synchronous signal transferred through the resistor R1 of the buffering circuit 30 at its identification terminal ID and converts the inputted analog synchronous signal into digital data as shown in FIG. 5B. Here, if the inputted analog synchronous signal is within a range of 0.0–3.0 V, it is converted into digital data of "0", which signifies the absence of the synchronous signal. Also, if the inputted analog synchronous signal is within a range of 3.5–5.0 V, it is converted into digital data of "1", which signifies the presence of the synchronous signal.

If the synchronous signal is absent, the microcomputer 23 continues to check the presence of the synchronous signal while checking the status mode. If the synchronous signal is present, the microcomputer 23 performs the twenty-third step S23 of comparing the automatic fine tuning voltage $V_{AFT}$ buffered by the buffering circuit 30 with the reference voltage of 2.5 V.

When the automatic fine tuning voltage $V_{AFT}$ is higher than the reference voltage of 2.5 V at the twenty-third step S23, the microcomputer 23 performs the twenty-fourth step S24 of increasing the tuning voltage to the tuner 24 at tuning speeds by bands in a third speed mode C as shown in FIG. 7. As a result, the automatic fine tuning voltage $V_{AFT}$ is decreased as the status mode is checked.

At that time the automatic fine tuning voltage $V_{AFT}$ becomes lower than the reference voltage of 2.5 V, the microcomputer 23 proceeds to the twenty-fifth step S25 of comparing the automatic fine tuning voltage $V_{AFT}$ buffered by the buffering circuit 30 with a reference voltage of 2.0 V.

If the automatic fine tuning voltage $V_{AFT}$ is lower than the reference voltage of 2.0 V at the twenty-fifth step S25, the microcomputer 23 performs the twenty-sixth step S26 of decreasing the tuning voltage to the tuner 24 in the third speed mode C as shown in FIG. 7. As a result, the automatic fine tuning voltage $V_{AFT}$ is increased as the status mode is checked. Then, when the automatic fine tuning voltage $V_{AFT}$ becomes higher than the reference voltage of 2.0 V, the microcomputer 23 performs repeatedly the above steps to correct the tuning voltage to the tuner 24 in such a manner that the automatic fine tuning voltage $V_{AFT}$ can be maintained within the range of 2.0–2.5 V.

On the other hand, the OSD character generator 27 generates the caption character signal addressed by the microcomputer 23 when the corresponding channel is tuned by the tuner 24. The caption character signal from the OSD character generator 27 is applied to the video synthesizer 28, which also receives the R, G and B color signals from the video processor 26. Then, the video synthesizer 28 synthesizes the received caption character signal and R, G and B color signals and outputs the resultant signal to the CPT 29.

As apparent from the above description, according to the present invention, when the TV channel is switched or the TV receiver is powered on, the tuning voltage to the tuner is corrected so that the automatic fine tuning voltage is initially maintained higher than the reference voltage of 4.7 V and then within the range of 2.0–2.5 V. Therefore, the actual pulling range of the automatic fine tuning is extended from Δf1 to Δf2 (audio band). This has the effect of performing the automatic tuning more finely. Also, the tuning of a low channel is avoided by eliminating Δf3 from the tuning pulling range in the channel search. Further, although the automatic fine tuning voltage is varied at the high or low temperature due to the temperature characteristics of the tuner and the IF processor, it is continuously checked to have the voltage range of 2.0–2.5 V. This has the effect of preventing the detuning.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. An apparatus for extending a pulling range of automatic fine tuning of a television receiver, comprising:

tuning means for tuning a television broadcasting signal received through an antenna to a specified channel corresponding to an external tuning voltage when a channel switching operation is perforated or the television receiver is powered on and outputting an intermediate frequency signal of the tuned television broadcasting signal;

intermediate frequency processing means for processing the intermediate frequency signal of the tuned television broadcasting signal from said tuning means to output an automatic fine tuning voltage and a synchronous signal;

buffering means for buffering the automatic fine tuning voltage and the synchronous signal from said intermediate frequency processing means; and control means for decreasing the tuning voltage to said tuning means until the automatic fine tuning voltage buffered by said buffering means becomes higher than a first predetermined reference voltage and controlling the tuning voltage to said tuning means if the automatic fine tuning voltage buffered by said buffering means becomes higher than the first predetermined reference voltage, to maintain the automatic fine tuning voltage buffered by said buffering means within a desired range between second and third predetermined reference voltages.

2. An apparatus for extending a pulling range of automatic fine tuning of a television receiver, as set forth in claim 1, wherein said buffering means includes:
   a first resistor connected between an synchronous signal output terminal of said intermediate frequency processing means and an identification terminal of said control means;
   a diode having an anode connected between the identification terminal of said control means anti said first resistor and a cathode connected to a power source terminal;
   a second resistor having one side connected to the power source terminal and the other side connected to an automatic fine tuning voltage output terminal of said intermediate frequency processing means;
   a third resistor having one side connected to a ground and the other side connected to the other side of said second resistor;
   a transistor having a base connected between said second and third resistors, a collector connected to the power source terminal and an emitter connected to the ground through fourth and fifth resistors connected in series;
   a sixth resistor having one side connected between said fourth and fifth resistors and the other side connected to the ground and to an automatic fine tuning terminal of said control means; and
   a capacitor connected between the other side of said sixth resistor and the ground.

3. A method of extending a pulling range of automatic fine tuning of a television receiver, comprising the steps of:
   (a) outputting an initial tuning voltage to a tuner when a channel switching operation is performed or the television receiver is powered on and receiving an automatic fine tuning voltage of a specified channel which is tuned by said tuner according to the outputted initial tuning voltage;
   (b) comparing the received automatic fine tuning voltage with a first predetermined reference voltage and controlling the tuning voltage to said tuner by bands in accordance with the compared result;
   (c) checking whether the received automatic fine tuning voltage is within a desired range between second and third predetermined reference voltages, if the received automatic fine tuning voltage is higher than the first predetermined reference voltage, and controlling the tuning voltage to said tuner by the bands if it is checked that the received automatic fine tuning voltage is not within the desired range, to maintain the received automatic fine tuning voltage within the desired range; and
   (d) checking presence of a synchronous signal of the specified channel if the received automatic fine tuning voltage is within the desired range, controlling the tuning voltage to said tuner by the bands if it is checked that the synchronous signal of the specified channel is present, to maintain the received automatic fine tuning voltage within the desired range, and outputting the initial tuning voltage to said tuner if it is checked that the synchronous signal of the specified channel is not present, to continue to check the presence of the synchronous signal of the specified channel.

4. A method of extending a pulling range of automatic fine tuning of a television receiver, as set forth in claim 3, wherein the tuning voltage to said tuner is decreased by the bands in a first speed mode if the received automatic fine tuning voltage is lower than the first predetermined reference voltage, to maintain the received automatic fine tuning voltage higher than the first predetermined reference voltage.

5. A method of extending a pulling range of automatic fine tuning of a television receiver, as set forth in claim 3, wherein the tuning voltage to said tuner is increased by the bands in a second speed mode if the received automatic fine tuning voltage is higher than the third predetermined reference voltage, to maintain the received automatic fine tuning voltage within the desired range.

6. A method of extending a pulling range of automatic fine tuning of a television receiver, as set forth in claim 3, wherein the tuning voltage to said tuner is controlled by the bands in a third speed mode if the received automatic fine tuning voltage is not within the desired range upon the presence of the synchronous signal, to maintain the received automatic fine tuning voltage within the desired range.

7. A method of extending a pulling range of automatic fine tuning of a television receiver, as set forth in claim 3, wherein the first predetermined reference voltage is 4.7 V.

8. A method of extending a pulling range of automatic fine tuning of a television receiver, as set forth in claim 3, wherein the second and third predetermined reference voltages are 2.0 V and 2.5 V, respectively.

9. A method of extending a pulling range of automatic fine tuning of a television receiver, as set forth in claim 4, wherein a speed of the tuning voltage to said tuner is different by VHF-L, VHF-H and UHF bands in the first speed mode.

10. A method of extending a pulling range of automatic fine tuning of a television receiver, as set forth in claim 9, wherein the speeds of the tuning voltage to said tuner by the VHF-L, VHF-H and UHF bands in the first speed mode are eight times, four times and twice a unit speed of the tuning voltage to said tuner, respectively.

11. A method of extending a pulling range of automatic fine tuning of a television receiver, as set forth in claim 5, wherein speeds of the tuning voltage to said tuner by VHF-L, VHF-H and UHF bands in the second speed mode are four times, twice and one time a unit speed of the tuning voltage to said tuner, respectively.

12. A method of extending a pulling range of automatic fine tuning of a television receiver, as set forth in claim 6, wherein speeds of the tuning voltage to said tuner by VHF-L, VHF-H and UHF bands in the third speed mode are the same.

13. A method of extending a pulling range of automatic fine tuning of a television receiver, as set forth in claim 12, wherein the speeds of the tuning voltage to said tuner by the VHF-L, VHF-H and UHF bands in the third speed mode are one time a unit speed of the tuning voltage to said tuner, respectively.

14. A method of extending a pulling range of automatic fine tuning of a television receiver, as set forth in claim 9, wherein the unit speed of the tuning voltage to said tuner is 33/16384 V.

15. A method of extending a pulling range of automatic fine tuning of a television receiver, as set forth in claim 10, wherein the unit speed of the tuning voltage to said tuner is 33/16384 V.

16. A method of extending a pulling range of automatic fine tuning of a television receiver, as set forth in claim 11, wherein the unit speed of the tuning voltage to said tuner is 33/16384 V.

17. A method of extending a pulling range of automatic fine tuning of a television receiver, as set forth in claim 12, wherein the unit speed of the tuning voltage to said tuner is 33/16384 V.

18. A method of extending a pulling range of automatic fine tuning of a television receiver, as set forth in claim 13, wherein the unit speed of the tuning voltage to said tuner is 33/16384 V.

* * * * *